(12) United States Patent
Barkowski et al.

(10) Patent No.: US 10,892,430 B2
(45) Date of Patent: Jan. 12, 2021

(54) INDUCTIVELY DOPED MIXED LAYERS FOR AN OPTOELECTRONIC COMPONENT, AND METHOD FOR THE PRODUCTION THEREOF

(71) Applicant: INURU GMBH, Berlin (DE)

(72) Inventors: Patrick Barkowski, Berlin (DE); Marcin Ratajczak, Berlin (DE)

(73) Assignee: INURU GMBH, Berlin (DE)

( * ) Notice: Subject to any disclaimer, the term of this patent is extended or adjusted under 35 U.S.C. 154(b) by 0 days.

(21) Appl. No.: 16/335,419

(22) PCT Filed: Oct. 13, 2017

(86) PCT No.: PCT/EP2017/076172
§ 371 (c)(1),
(2) Date: Apr. 16, 2019

(87) PCT Pub. No.: WO2018/069496
PCT Pub. Date: Apr. 19, 2018

(65) Prior Publication Data
US 2020/0020871 A1    Jan. 16, 2020

(30) Foreign Application Priority Data

Oct. 14, 2016 (DE) .......................... 10 2016 119 599
Jul. 28, 2017 (DE) .......................... 10 2017 117 082

(51) Int. Cl.
*H01L 51/50* (2006.01)
*H01L 51/00* (2006.01)

(52) U.S. Cl.
CPC ...... *H01L 51/5008* (2013.01); *H01L 51/0004* (2013.01); *H01L 51/0043* (2013.01);
(Continued)

(58) Field of Classification Search
CPC ............. H01L 51/5008; H01L 51/0004; H01L 51/0043; H01L 51/5056; H01L 51/5076; H01L 51/5092; H01L 51/56
See application file for complete search history.

(56) References Cited

U.S. PATENT DOCUMENTS

2004/0096570 A1* 5/2004 Weaver ............... H01L 51/0003
427/66
2004/0147113 A1* 7/2004 Yamazaki ............ H01L 21/288
438/660

FOREIGN PATENT DOCUMENTS

| EP | 2315291 A1 | 4/2011 |
|----|------------|--------|
| EP | 2728639 A1 | 5/2014 |
| JP | 2007042314 A | 2/2007 |

OTHER PUBLICATIONS

Hansen, C.M., "The Three Dimensional Solubility Parameter and Solvent Diffusion Coefficient, Their Importance in Surface Coating Formulation", 1967, 103 pages, Danish Technical Press, Copenhagen; https://hansen-solubility.com/contents/HSP1967-OCR.pdf.
(Continued)

*Primary Examiner* — Karen Kusumakar
(74) *Attorney, Agent, or Firm* — Blue Filament Law PLLC

(57) ABSTRACT

An optoelectronic component with a cathode and an anode and a layer system between the cathode and the anode is provided. The optoelectronic component having multiple electroactive layers, wherein the component can be produced by a method in which an inductively doped mixed layer is generated between at least two layers made of semiconductor materials.

7 Claims, 4 Drawing Sheets

(52) U.S. Cl.
CPC ...... *H01L 51/5056* (2013.01); *H01L 51/5076* (2013.01); *H01L 51/5092* (2013.01)

(56) References Cited

OTHER PUBLICATIONS

Salzmann, I. et al., "Intermolecular Hybridization Governs Molecular Electrical Doping", Physical Review Letters, Jan. 18, 2012, pp. 035502-1-035502-5, vol. 108, No. 035502, © 2012 American Physical Society; DOI: 10.1103/PhysRevLett.108.035502.

Mendez, H. et al., "Doping of Organic Semiconductors: Impact of Dopant Strength and Electronic Coupling", Angew. Chem. Int. Ed., 2013, pp. 1-6, vol. 52, © 2013 Wiley-VCH Verlag GmbH & Co.; DOI: 10.1002/anie.201302396.

Gorter, H. et al, "Toward inkjet printing of small molecule organic light emitting diodes", Thin Solid Films, 2013 (Available online: Jan. 31, 2013), pp. 11-15, vol. 532, © 2013 Elsevier B.V.; DOI: 10.1016/j.tsf.2013.01.041.

International Search Report dated Feb. 1, 2018 for International Application No. PCT/EP2017/076172 filed Oct. 13, 2017.

* cited by examiner

INDUCTIVELY DOPED MIXED LAYERS FOR AN OPTOELECTRONIC COMPONENT, AND METHOD FOR THE PRODUCTION THEREOF

The invention preferably relates to an optoelectronic component with a cathode and an anode and with a layer system between the cathode and the anode, comprising multiple electroactive layers, wherein the component can be produced by a method in which an inductively doped mixed layer is generated between at least two layers made of semiconductor materials.

PRIOR ART AND BACKGROUND

The invention relates to the field of optoelectronic components. Optoelectronic components, for example, on an organic base, or in the form of hybrid components made of organic and inorganic layers, are commonly used in the technology.

Organic light emitting diodes (OLEDs) consist generally of a sandwich structure, wherein multiple layers of organic semiconductor materials are generally located between two electrodes. In particular, an OLED comprises one or more emitter layers (EL) in which electromagnetic radiation, preferably in the visible range, is generated by a recombination of electrons with electron holes. The electrons and electron holes are provided in each case by a cathode or anode, wherein preferably so-called injection layers facilitate the process by lowering the injection barrier. Therefore, OLEDs generally have electron or hole injection layers. Moreover, as a rule, OLEDs have electron transport layers (ETL) and hole transport layers (HTL) which promote the diffusion direction of the electrons and holes toward the emitter layer. In the case of OLEDs, these layers are constructed from organic materials, in the case of hybrid optoelectronic component parts, the layers can comprise in part organic and in part inorganic semiconductor materials. To simplify the terminology, hybrid LEDs, which can comprise organic and inorganic semiconductor layers, are also referred to as organic light emitting diodes (OLEDs).

In comparison to conventional inorganic LEDs, OLEDs are characterized by a thin and flexible layer structure. For this reason, OLEDs can be used in clearly more varied applications than conventional inorganic LEDs.

Due to the flexibility, OLEDs are excellently suited for use in screens, electronic paper or interior lighting, for example.

The advantageous properties of optoelectronic components comprising organic semiconductor materials for light generation (OLEDs) can also be applied to the generation of electric current. Thus, organic solar cells or hybrid cells are also characterized by a thin layer structure which clearly increases the application possibilities in comparison to conventional inorganic solar cells. The construction of organic solar cells or hybrid solar cells is similar to that of OLEDs or hybrid LEDs. For linguistic simplification, hybrid solar cells made of organic-inorganic layers are also subsumed under the term organic solar cells.

However, instead of an emitter layer, one or more absorber layers are present as photoactive layer. In the absorber layer, due to the incident electromagnetic radiation, electron-hole pairs are generated. In contrast to inorganic solar cells, as a rule, in the organic emitter layer, first the formation of so-called excitons occurs, which are present as bound electron-hole pairs. They are subsequently separated into free charge carriers.

The additional layers comprise electron and hole transport layers as well as electron extraction and hole extraction layers. They consist of organic materials or of organic and inorganic materials, the electrochemical potentials of which are shifted as donor and acceptor layers in such a manner that they generate an internal field in the solar cell, which separates the excitons and dissipates the free charge carriers toward the electrodes. Due to the incidence of the electromagnetic radiation in the absorber layer, electrons are thus provided at the cathode and electron holes at the anode for the generation of a voltage or a current.

The particular advantage of organic solar cells consists in particular of the very high optical absorption coefficients of organic semiconductors, whereby, even in the case of thin absorption layers in the range of less than 100 nm, excellent results can still be achieved.

Due to the thin layer structure, organic solar cells can be produced advantageously and they can be applied as film coating over large surfaces to buildings or integrated in paper products such as packagings.

Additional application possibilities for optoelectronic components made of organic or inorganic-organic layers relate, for example, to photodetectors. They too use the photoelectric effect, wherein electron-hole pairs are generated in the photoactive layer. Instead of being used for generating current, as in solar cells, they are used for detecting light, for example, for cameras.

Based on organic semiconductors, the thin layer structure of the above-mentioned optoelectronic components not only enables a clearly more flexible use in everyday life, but also is characterized, in comparison to the conventional LEDs, solar cells or photodetectors based on inorganic semiconductors, by cost-effective production possibilities.

However, in comparison to organic semiconductors, the currently used organic semiconductors have disadvantages. Thus, the electrical performance of the organic semiconductors, i.e., in particular the conductivity, is on average poorer than that of conventional inorganic semiconductors. This results in particular from a lower charge density of the free charge carriers in organic semiconductors.

In organic electronics, the materials of the semiconductor layers are constructed from so-called pi systems or Π systems. The pi systems of the organic molecules and/or polymers used have delocalized, i.e., free electrons, which enable charge or current flow in the materials.

The conductivity in organic semiconductors is predetermined essentially by the number of the delocalized electrons (pi electrons) present. Moreover, the pi electrons are delocalized only on the pi orbitals which have a special geometric shape and thus bring about an anisotropic (not homogeneous in all directions in space) electrical conductivity in the organic materials.

This results in a natural limitation. This limitation manifests itself as a limiting factor for the electrical conductivity of the organic systems.

The charge transport (electric current) and the intrinsic electric charges in an organic semiconductor are typically lower by a few orders of magnitude than in an inorganic semiconductor.

In order to improve the electrical conductivity and performance of organic semiconductors, it is known to dope organic semiconductors with other organic materials. Here, foreign molecules are introduced into the organic semiconductor layers in order to influence the electrical properties and in particular the charge carrier density in a targeted manner. For example, inorganic molecules having different electron affinities or ionization potentials can be introduced in order to reduce or oxidize the molecules of the organic semiconductor. In contrast to inorganic semiconductors, into which foreign atoms with a different configuration are introduced, the mass fractions of the dopants are considerably higher. Although the introduced quantity of dopants is lower than that of the carrier material, concentrations of the doping substances in the per mil or percent range are not unusual. In so-called p-doping, electron acceptors are doped, whereas in the so-called n-doping, electron donors are doped.

Various methods have been developed for the application of the organic semiconductor layers for producing an optoelectronic component. They include, in particular, vacuum vaporization processes or wet chemical deposition methods.

In the vaporization processes, the molecules are deposited by vaporization, i.e., by sublimation under vacuum conditions. The methods are therefore also referred to vacuum deposition. The vacuum vaporization processes allow the production of particularly defined layers, wherein a doping of the organic semiconductor is also possible. However, the disadvantage of the methods is the high process costs. On the one hand, expensive installations are necessary for the vacuum deposition. Moreover, the methods are characterized by a high material loss, since the deposition as a rule occurs nonspecifically and the deposition occurs not only on the substrate but also on other parts of the vaporization installations.

For mass production of organic component parts, wet chemical deposition processes are much more promising. Here, a fluid processing of the organic semiconductor materials occurs. For this purpose, the organic materials are present dissolved in appropriate selected solvents.

Known wet chemical methods are, for example, the spin coating method wherein the substrate is applied to a rotary plate and solutions with polymers or small molecules can be applied evenly by spin coating. In the dip-coating method, a substrate is immersed in a coating solution. When the substrate is pulled out, a fluid film remains on it, so that the layers can be applied one after the other.

In addition, printing methods such as, for example, the ink jet (ink jet printing), slot die (slot die coating), blade coating (film coating) methods are characterized by a particularly high flexibility with low production costs.

While, in the spin coating or dip coating methods, doped organic semiconductors can also be applied, this is not possible on the industrial scale in the common printing methods. By the doping of the organic semiconductors, aggregates form in the solution, which prevent an effective printing or at least impede it considerably. Here clogging occurs in the printing heads. Although clogging can be reduced via filtering processes, such filtering of the aggregates leads precisely to an elimination of the desired doping.

Thus, at this time, there are no suitable printing methods in industry for the reliable and cost-effective production of organic optoelectronic component parts with printing of p- or n-doped organic materials.

Another disadvantage of known printing methods for organic semiconductor layers manifests itself in the production of thin layer component parts having complex, multi-layered structures with 3-8 layers, for example.

For modern component parts in organic electronics, such as, for example, organic light emitting diodes, transistors and solar cells, a functionally optimized multi-layered structure is preferably used. The different layers such as, for example, hole transport layer, hole injection layer, electron transport layer, etc., fulfill a particular purpose in the component, in order to increase the electrical efficiency or performance of the component. By an adjustment of the electrical properties of multiple injection and transport layers, it is possible, for example, to achieve that OLEDs generate a stronger luminosity with the same voltage and the same current consumption.

In the prior art, it is assumed that, during the printing of such multi-layered structures with, for example, 3-8 layers lying one on top of the other, each successive layer after the first layer must not superficially dissolve or detach the lower layers. Such uncontrolled superficial dissolution could otherwise lead to defects or damage of the layers, thereby considerably reducing the electrical performance as well as the useful life of the optoelectronic component part.

In order to prevent superficial dissolution of the different layers, different processes have been established. This relates in particular to a crosslinking and to the use of orthogonal solvents.

Typical temperatures for crosslinking are 150-250° C., while normal drying of the wet layer occurs at 100-140° C. In addition, the crosslinking method tends rather to damage the organic materials (degradation temperatures of the organic materials are in the range of 140-250° C.) and is limited in use to only to a few highly stable organic materials. Moreover, processing in air is also no longer possible, since the organic materials below their intrinsic decomposition temperatures start to oxidize with oxygen.

During crosslinking, the printed ink, i.e., the organic material which is present dissolved in a solvent, after the printing is activated energetically with strong UV radiation or very high temperatures above 150° C. Thereby, a chemical process is started, which leads to intramolecular crosslinking of the molecules or polymers. In the final result, a chemically bound network is created, which can be dissolved only with difficulty.

However, a disadvantage here is that the initiated chemical reaction for crosslinking the organic material has a negative influence on the electrical performance, in particular due to a decrease of the charge carrier mobility. For example, the pi systems responsible for the charge transport often are impaired or destroyed.

Typical temperatures for the crosslinking are 150-250° C., while the normal drying of the wet layer occurs at 100-140° C. From this, it results that the crosslinking method tends to damage the organic materials. The decomposition temperatures of the commonly used organic materials are in the range of 140-250° C. For this reason, crosslinking methods limit the use to only a few highly stable organic materials. Moreover, processing in air is not possible, since the organic materials below their intrinsic decomposition temperatures start to oxidize with oxygen. An alternative to this consists of the use of orthogonal solvents. Here, the inks for the printing of the organic semiconductor layers are produced in such a manner that the solvent of a next layer cannot superficially dissolve the lower layer. I.e., the material of the lower layer should be insoluble in the solvent of the next layer. However, it is precisely in thin layer structures with more than 3 layers that this condition rapidly leads to difficulties in the practical implementation. In particular, in the case of more than 4 layers, there are hardly any orthogonal solvents that reliably prevent the superficial dissolution of lower layers.

To counter the problem, namely that subsequently printed layers can superficially dissolve and thus damage the underlying layers, work is often carried out in industry using a mixed (hybrid) process. Here, commonly the first one to three layers, i.e., the layers up to the light-emitting layer, are printed, while the remaining layers are applied by a vacuum vaporization method. The hybrid methods are clearly more expensive and cost-intensive than a complete printing of the layers, due to the necessity of the additional vapor deposition steps.

AIM OF THE INVENTION

The aim of the invention was to develop an optoelectronic component which eliminates the disadvantages of the prior art, and a method for producing same. In particular, an optoelectronic component and a method for producing same were to be provided, wherein a doping of printed organic materials is achieved in a cost-effective, reliable and simple manner, in order to ensure at the same time a high electrical performance of the component part. Moreover, the invention was preferably to allow the provision of a printed optoelectronic component part having a multilayered thin layer structure, in which undesired superficial dissolution processes can be prevented in a simple and effective manner.

SUMMARY OF THE INVENTION

The aim of the invention is achieved by the independent claims. The dependent claims characterize preferred embodiments of the inventive optoelectronic component part and of the inventive method for producing an optoelectronic component part.

In a preferred embodiment, the invention relates to an optoelectronic component with a cathode and an anode and with a layer system between the cathode and the anode, comprising multiple electroactive layers and at least one optically active layer, wherein at least two layers between the cathode and anode can be produced by a method which comprises the following steps:

a) provision of a first ink comprising a first semiconductor material dissolved in a first carrier means b) provision of a second ink comprising a second semiconductor dissolved in a second carrier means c) generation of a first layer by application of the first ink with the help of a printing method d) drying of the first layer e) application of the second ink with the help of a printing method onto the first layer for the generation of a second layer, f) drying of the second layer wherein the second carrier means is selected in such a manner that, by method step e), the first layer is at least partially superficially dissolved, so that between the first and second layer, an inductively doped mixed layer is generated, in which the first and second semiconductor materials are present mixed.

It can also be preferable that the method is modified in the following manner: after step b) follows step b-bis) provision of a substrate.

In this modified method, moreover step c) becomes step c') generation of a first layer by application of the first ink with the help of a printing method onto the substrate.

By this modified method, a very reliable and robust component can be produced.

The optoelectronic component according to the invention is preferably characterized in that it comprises electrodes (i.e., an anode or a cathode), an optically active layer and electrically active layers (i.e., for example, charge carrier injection or extraction layers, or charge carrier transport layers). The functionality of the optoelectronic component is preferably characterized by the optically active layer which can be used in particular for light or current generation. The electrically active layers in the sense of the invention denote the layers which ensure the electrical functionality of the component and are arranged between the optically active layer and the electrodes. In the sense of the invention, for example, charge carrier injection or extraction layers and charge carrier transport layers are electrically active layers. Moreover, in the sense of the invention, charge carriers are preferably understood to mean electrons or electron holes. The term hole or electron hole here is preferably used synonymously. The person skilled in the art knows how the electrically active layers should be arranged in order to achieve, as a function of the optically active layer, the desired function of the optoelectronic component. The terms optoelectronic component or component part or also thin-layer component part or thin-layer component are preferably used synonymously. The terms used here for describing the optoelectronic component part such as, for example, electrode, anode, cathode, optically active layer, charge carrier extraction or injection layer, and charge carrier transport layer should be understood to have the meaning that the person skilled in the art would use in this connection. Further definitions can also be found below in this document.

The semiconductor material preferably denotes organic semiconductor materials. However, hybrid materials made of organic and inorganic semiconductor materials or else inorganic semiconductor materials can also be used. The term organic semiconductor material preferably denotes organic-based materials which are semi-conducting due to the configuration of a pi electron system. The terms semiconductor and semiconductor materials are preferably used synonymously. The terms used here such as semiconductor and pi electron system should preferably be understood to be as they would be interpreted by the person skilled in the art or as they are used in the specialty literature, for example, in *Low Molecular Weight Organic Semiconductors* by Thorsten U. Kampen.

The inventive optoelectronic component part is preferably characterized in that the electrically active and/or optically active layers can be applied with the help of a printing method. The term printing method should be understood in its broadest sense covering all methods for the reproduction of physical or electronic masters, wherein a substrate of semiconductor materials in the form of a printing ink can be applied. The term printing method can also subsume in the broadest sense all the methods for reproducing physical or electronic masters, in which semiconductor materials in the form of a printing ink can be applied onto a substrate. In the sense of the invention the term printing ink or ink is preferably understood to mean a composition which is present in liquid form at room temperature, which comprises or consists of a semiconductor material and a carrier material. The carrier means is preferably a solvent or solvent mixture in which the semiconductor material to be printed is present dissolved, so that the layers for the optoelectronic component can be applied using common printing methods.

As printing methods, one can consider, for example, offset printing, screen printing, flexo printing or, in particular, ink jet printing methods and/or slit nozzle coating methods. In contrast to vaporization methods, for example, the printing methods are characterized in particular by their high suitability for mass production. In addition, the process is particularly cost-effective.

In the generally used organic doping, such as, for example, in the case of Novaled materials, new electronic bands are generated, whereby the charge carrier concentration is increased in a manner similar to the case of inorganic doping. Here, a charge transfer from the donor to the acceptor in the fundamental energy state occurs without additional excitation, when the two materials are mixed with one another. In this process, aggregates form, which are also referred to as charge transfer complexes. They represent a new material formed from the two original materials, which forms the doping itself.

As a basis for the invention, it has been recognized that, in known optoelectronic components which can be produced by printing methods, doped layers made of organic semiconductor materials cannot be applied, because for the rest, for example, clogging on printing nozzles can occur due to aggregate formation during the printing of the organic materials in the inks. Thereby, the electrical conductivity of the electrically active layers can be considerably limited in known printed optoelectronic component parts.

Surprisingly, according to the invention, a printed component part can be provided which, via a printing method, comprises doped layers made of organic semiconductor material, without this leading to complications during the production.

For this purpose, in contrast to the known approaches, the printing does not occur with ink which already containing doped organic semiconductor material is printed. Instead, according to the invention, it has been recognized, that in the case of an appropriate selection of the carrier material of the inks used for the printed layers, a doping of the layers can occur after the printing can occur. For this purpose, the effect of inductive doping is exploited, which is based on the fact that only the charge carrier density in the mixed material is shifted due to different electronic affinities of donor and acceptor, and as a result the corresponding charge type gains in mobility, which increases the electrical conductivity. Here, it is not primarily an increase in the charge carrier concentration, but is rather an increase in the mobility of the charge carrier that occurs.

In the inventive optoelectronic component part, it is preferable in this regard for the second carrier means to be selected so that, after the application onto a lower or first layer, said first layer is at least partially superficially dissolved, that is to say preferably that the superficially dissolved portion of the layer, which when applied is in a solid aggregate state, is advantageously again substantially liquefied and brought into a state such that mixing of this portion with a second carrier means is possible. For this purpose, the carrier means should preferably be selected so that it represents a moderate to poor solvent for the first semiconductor material of the lower or first layer.

Due to the dissolution property of the printed second carrier means, on the boundary surface between the two layers, an inductively doped mixed layer is generated. Here, a partial leaching of the organic or inorganic molecules from the first or lower layer into the applied second layer occurs. In the mixed layer generated in the process, the first and second semiconductor materials are thus present mixed in the boundary region of the two layers. Thereby, a doped semiconductor material is implemented. According to the inductive effect in organic chemistry, the electrical charges in the mixed layer thereby gain in mobility. In the process, there is no generation of additional free charge carriers, but rather there is a shift of the Fermi level in the desired direction by polarization effects.

The inductive effect is caused in particular by a different electronegativity of atoms or functional groups of a carbon compound. This leads to a charge asymmetry, whereby the electron density in the molecules changes. In a negative inductive effect (−I effect), the electrons shift towards the atom or molecule with higher electronegativity, whereas in the positive inductive effect, electrons are pulled away from atoms or molecules with low electronegativity. The shift of the charge carriers advantageously leads to a higher mobility of the charge carriers.

In the sense of the invention, the inductively doped mixed layer thus preferably denotes a mixed layer formed by superficial dissolution, in which, due to doping based on the inductive effect, the electrical conductivity is increased.

Advantageously, in inductive doping, the doped layer could also be printed in one step, without aggregate formation occurring as is the case in known dopings by the formation of the charge transfer complexes (compare FIG. 3 and FIG. 4). The process of dissolution or superficial dissolution is advantageous for the formation of an inductively doped mixed layer is indeed advantageous since here the number of printing steps can be reduced. Instead of three printing steps, as in the case of a separate printing of the inductive mixed layer, only two printing steps are necessary.

The inventive optoelectronic component part is thus characterized by a particularly satisfactory electrical performance which can be brought about by a cost-effective and reliable printing method. An improvement of the performance of the component part is achieved. Moreover, by the method, a saving of time, material and work steps can be achieved, and the production is simplified. In particular due to the reduction of the work steps, errors can be eliminated and the quality can be increased. The presented method increases the number of technical possibilities for producing optoelectronic components.

The layers to be printed using the inks comprising organic and/or inorganic semiconductor materials can preferably be both electroactive layers, i.e., for example, injection or extraction layers or transport layers, and also optically active layers. The method presented thus constitutes an alternative to common methods for a wide variety of layers.

For example, the first and second layer can each be a first and a second electroactive layer, wherein, between these electroactive layers, the advantageously inductively doped mixed layer is generated. However, the first layer can also be, for example, an electroactive layer, while the second layer is an optically active layer, so that an inductively doped mixed layer is formed between these layers.

The inventive optoelectronic component is preferably characterized by the presence of at least two layers made of organic and/or inorganic semiconductor material with inductive mixed layer in their boundary region. Additional layers of the optoelectronic component can but do not have to be printed using organic semiconductor materials. For example, it can be preferable that an additional electron transport layer comprises inorganically doped semiconductor materials, for example, aluminum zinc oxide. The layers thus combined can lead to an improvement of the component part.

In a particularly preferred embodiment, the thickness of the mixed layer is between 1 nm and 20 nm, preferably between 1 nm and 10 nm. On the one hand, it is particularly preferable for the thickness of the mixed layer to be between 1 nm and 20 nm. This thickness leads to particularly advantageous electrical properties and at the same time has been found to be surprisingly easy to implement in the above-presented method. Here, it is particularly preferable for the thickness of the mixed layers to be between 1 nm and 10 nm. Such a thickness of the mixed layer increases the effectiveness of the component, in particular by improved electrical properties. The thickness of the mixed layer corresponds preferably to the area in the boundary region between the first and second layers, in which the first and second semiconductor materials are present. The lower boundary of the mixed layer thus corresponds to the upper region of the first layer, which has not been superficially dissolved. While the upper boundary of the mixed layer corresponds to the lower region of the second layer, in which molecules of the first semiconductor material are no longer present and thus no doping is present. Preferably, lower and upper denote the direction along the successive application of the layers.

The thickness of the mixed layer can be set in particular by the solubility of the first semiconductor material and the duration of exposure before the drying. Drying is preferably understood to mean an induced action of heat, in order to convert a material from an at least partially liquid aggregate state to a solid aggregate state. It can also be preferable, in particular when a solution is present, to evaporate the at least one solvent, so that only the previously dissolved solid components of the solution remain. By measurement of the thickness of the mixed layer and knowledge of the solubility of the material of this layer in corresponding solvents, correspondingly suitable carrier means can be determined routinely.

For the measurement of the thickness of the mixed layer, it is possible to exploit the fact that, in the inductive doping, a shift of the optical absorption edge toward shorter or longer wavelengths can be observed. On the basis of the shift of the optical band edge, the strength of the inductive doping and thus the layer thickness can be determined. For this purpose, a UV-Vis spectrometer can be used preferably as measurement instrument. With a UV-Vis spectrometer, spectroscopy using UV and visible light can preferably be performed. UV light is preferably understood to mean light in a wavelength range from less than 10 nm up to 380 nm. To the person skilled in the art, visible light is understood to mean in particular light from 380 nm to 700 nm.

In order to set a certain layer thickness, the following empirical method can be used, for example. An ink is first produced from multiple solvents and a solid dissolved therein, i.e., a semiconductor material.

In the selection of the solvent for the ink, it is preferable to take a solvent A which can dissolve the lower layer and a solvent B which cannot dissolve the lower layer.

From the two solvents A and B, mixtures having different mixing ratios are prepared, wherein, however, the concentration of the solid to be dissolved therein is kept constant. It has been found to be particularly effective to work with mass ratios of the solvents with respect to one another in proportions of 30:70, 50:50 and 70:30. An empirical method which works with the above-mentioned proportions has been found to be excellent due to its particular efficiency. It was surprising that by means of such a test method a suitable carrier means could already be found within one test iteration.

Subsequently, all three ink combinations are printed on separate sites of the lower layer to be superficially dissolved. By means of UV-Vis spectrometer, the strengths of the inductive doping and of the optical band edge can be determined. In the evaluation, it is necessary to also take into consideration the absorption of the pure materials, i.e., of the lower layer and of the solid which was printed.

The preferred layer thicknesses mentioned for the mixed layer are particularly advantageous in combination with a layer thickness of the first or second layer between 5 nm and 50 nm. In this range, the inductively doped mixed layer optimally promotes the electrical conductivity between the layers, without affecting the specific functionality of the layers, for example, as transport or injection layer.

In a preferred embodiment of the invention, the second carrier means comprises at least one solvent which completely dissolves the first semiconductor material up to a concentration of at least 1 g/L. The solubility of the first semiconductor material in the second carrier means is thus at least 1 g/L (gram per liter). The indication corresponds to the common definition of the quantitative solubility by a mass concentration. The solubility preferably indicates the concentration up to which the material can be dissolved in the solvent. I.e., concentration up to which it mixes in the solvent with a homogeneous distribution, without precipitating. The mentioned boundary enables a particularly reliable formation of an inductively doped mixed layer, having in particular the preferred thicknesses of 1 nm to 20 nm, preferably 1 nm to 10 nm. By this preferred embodiment, errors in the production of the mixed layer can be eliminated.

The solubility can be predicted on the basis of theoretical models. For example, the Hansen solubility parameters can be suitable for this purpose (Hansen, Charles M. "The three dimensional solubility parameter." *Danish Technical: Copenhagen:* 14 (1967)). However, preferably the solubility is determined experimentally. A suitable experimental method for the determining the quantitative solubility is the following method, which comprises the dissolving of 10 milligrams of the solid in 10 milliliters of the solvent in consideration. The quantity of the solid is added to the vessel with the solvent. In addition, a Teflon-coated magnetic stirring rod is added, and the vessel is closed in a gas-tight manner. Subsequently, the vessel is placed on a heating plate with a controllable magnetic field, a heating temperature of 25° C. is set, and the magnetic field is switched on so that the stirring rod stirs the mixture. This process is carried out for 24 hours. Then, the vessel is opened and the solution is filtered through a microsieve (pore size 0.2 μm). The weight of the vessel in which one captures the filtered solution is determined beforehand. After the filtering, the solution is evaporated in a vacuum oven. The heating temperature depends on the solvent used. After heating to dryness, the weight of the vessel is determined again, wherein the increase in weight corresponds to the amount of solid dissolved in the 10 milliliters of solvent. By this method, the quantitative solubility can be determined particularly reliably.

The use of inks for the application of the layers, that is to say the electroactive or optically active layers, with solvent thus selected represents a deviation from the prior art with surprising advantages. In the prior art solvents are selected in particular, which precisely are not supposed to superficially dissolve the underlying layer, in order to obtain smooth boundary surfaces. That a suitable selection of the solubility leads to the formation of a mixed layer and thus to improved electrical performances was a surprising finding.

Quantitative solubilities of at least 1 g/L are achieved in particular by the class of materials of the aprotic polar solvents.

In a preferred embodiment, the second carrier means therefore comprises at least one aprotic polar solvent.

If a molecule of a solvent does not have an atom group in which an organic compound is present and from which hydrogen atoms as protons can be cleaved off, the solvent is referred to as aprotic. Polarity preferably refers to the formation of separate centers of gravity of charge formed as a result of a charge shift in atom groups, by means of which the neutrality of the atom groups can be suspended.

By the provision of a second carrier material in the form of an aprotic polar solvent, an inductively doped mixed layer having the above-mentioned properties can be produced particularly simply and reliably.

In an additional preferred embodiment of the invention, the optoelectronic component is characterized in that the printing method is a slit nozzle coating, an engraving printing, a screen printing, a doctor blade printing, a spraying and/or ink jet printing method. The slit nozzle coating is preferably a coating technique known to the person skilled in the art which is used in order to apply thin liquid layers onto web-type substrates. Engraving printing refers in particular to a type of gravure printing method familiar to the person skilled in the art. A gravure printing method is advantageously a printing technique in which the elements to be reproduced are present as recesses in a printing block. Here, the printing ink is typically present only in the recesses, and the substrate to be printed on is pressed against the printing block. Screen printing preferably refers to a printing method in which the printing ink is printed through a fine-meshed fabric onto the substrate or material to be printed on. In doctor blade printing, preferably a so-called doctor blade is used in order to wipe off excess printing ink from the printing cylinder. In the ink jet printing method, a printed image is generated by targeted shooting or deflection of small ink droplets.

By means of the above-mentioned methods, in particular using ink jet printing methods, the layers can be applied particularly precisely and evenly. Thereby, mixed layers having a particularly reliable homogeneous distribution and doping are formed. The optoelectronic component thus produced is characterized by an excellent quality, robustness and performance.

The drying after the application of the second electroactive layer preferably completes the superficial dissolution process and determines the layer thickness of the mixed layer. For the drying, different methods are suitable, which preferably lead to an accelerated evaporation/of the carrier means or solvent by heating of the component. Hot air dryers are suitable, for example. However, it can also be preferable to let the layer dry at room temperature. In the case of a lower temperature during the drying, the drying will as a rule take longer.

In a preferred embodiment of the optoelectronic component, the drying occurs in step f), i.e., after the application of the second layer, with the help of an infrared lamp, preferably at a temperature between 60° C. and 200° C., particularly preferably between 80° C. and 150° C., for a drying time between 1 s and 60 s, preferably between 5 s and 30 s. By means of the preferred temperature range between 60° C. and 200° C. and the preferred drying time between 1 s and 60 s, a suitable layer system can be produced in a particularly reliable manner. By means of the mentioned temperature range and a preferred drying time between 5 s and 30 s, the robustness of the layer system is increased. It is particularly preferable to use during the drying a temperature range between 80° C. and 150° C. for a drying time between 1 s and 60 s. Thereby, errors in the production can be eliminated. In particular, a production comprising drying in the temperature range between 80° C. and 150° C. for a drying time between 5 s and 30 s leads to a simplification of the method and results in particularly robust components.

The use of an infrared lamp in particular using the above-mentioned temperatures and time durations represents particularly effective but at the same time mild drying. Thus, in contrast to, for example, known crosslinking methods, in the embodiment, a chemical activation of the materials concerned does not occur or barely occurs. While the carrier means is rapidly and efficiently brought to evaporation, the electrical or optical properties of the layers and of the mixed layer formed are preserved. In particular, such a drying method can be automated and rationalized very satisfactorily.

In an additional preferred embodiment, after the application of the second ink in step e) and the drying in step f), a waiting time between 0 and 60 s, preferably between 3 s and 40 s is observed. The waiting time preferably corresponds to the time provided at least for the drying and the formation of the mixed layer. The thickness of the mixed layer can thus be influenced by this parameter. In the case of the above-mentioned waiting times in connection with a quantitative solubility of the semiconductor material in the carrier means of at least 1 g/L, excellent results can be obtained. According to the experimental experience, it must be kept in mind that the process of the superficial dissolution starts already during the printing and does not end immediately with the start of the drying step. For that reason, it may also be preferable not to observe a waiting time, wherein, however, a waiting time of 3 s to 40 s produces particularly reliable mixed layers. Waiting times between 0 and 60 seconds also have advantages, mixed layers thus produced ensure a particularly high-performance component.

In an additional preferred embodiment, the optoelectronic component is characterized in that the second carrier means comprises a mixture of at least two different solvents, wherein the first solvent completely dissolves the first semiconductor material up to a concentration of at least 1 g/L, and a second solvent completely dissolves the first semiconductor material up to a concentration of at most 0.1 g/L.

In the preferred embodiment, the second carrier means, in which the second semiconductor material is present dissolved, therefore comprises a combination of different solvents of different superficial dissolution strength. Thereby, during the application of the second layer onto the first layer, the superficial dissolution process for the formation of the inductive mixed layer can be controlled particularly reliably.

The selection of the solvents depends advantageously on the semiconductor material of the first (lower) layer, which is to be dissolved.

If the first semiconductor material is an organic material, for example, a polyphenylenevinylene copolymer, for example, MEH-PPV, Super Yellow or MDMO-PPV, butyl lactate can be used as solvent with high superficial dissolution strength. The butyl lactate completely dissolves the polyphenylenevinylene copolymer of the lower first layer up to a concentration of at least 1 g/L. On the other hand, isopropanol, for example, dissolves polyphenylenevinylene copolymers only under 0.1 gram/liter. In this case, isopropanol is thus suitable as a solvent with weak dissolution strength. Therefore, as carrier means for the second organic semiconductor material, a combination of butyl lactate and isopropanol can be used preferably, wherein the ratio controls the superficial dissolution capacity. The higher the proportion of butyl lactate with respect to isopropanol is in the ratio, the larger the area of the inductively doped mixed layer will be. A ratio of butyl lactate to isopropanol of 30:70 has been found to be particularly advantageous for preferred layer thickness of the mixed layer of 1 nm to 10 nm. In this way, particularly robust components can be produced.

If, on the other hand, the first (lower) layer consists, for example, of poly(vinylidene chloride-co-acrylonitrile), a carrier means with a combination of the solvents ortho-dichlorobenzene and mesitylene in the ratio 80:20 is almost completely orthogonal. I.e., the solvent combination consisting of ortho-dichlorobenzene and mesitylene dissolves poly(vinylidene chloride-co-acrylonitrile) only below a concentration of 0.1 gram/liter. With the mentioned carrier means, a superficial dissolution of the layer of clearly less than 1 nm therefore occurs.

However, in order to achieve superficial dissolution for the formation of an inductively doped mixed layer, a more strongly dissolving solvent can be added to the carrier means. For example, acetophenone is suitable for this purpose, which can dissolve the poly(vinylidene chloride-co-acrylonitrile) at a concentration of clearly more than 1 g/L. By the addition of 5 volume % of acetophenone instead of o-dichlorobenzene, i.e., by the addition of a carrier means with 75 volume % o-dichlorobenzene, 20 volume % mesitylene and 5 volume % acetophenone, a superficial dissolution of 1-3 nm can be achieved, with respect to the poly(vinylidene chloride-co-acrylonitrile) (PVDC-co-PAN copolymer), whereby an electrically advantageous doped mixed layer is achieved.

The addition of small quantities of particularly strongly dissolving solvents to an orthogonal solvent combination enables a particularly precise adjustment of the superficial dissolution behavior of the second carrier means.

Advantageously, aprotic polar solvents are suitable, such as, for example, acetophenone, not only for the PVDC-co-PAN copolymers mentioned as examples, but also for almost all the organic semiconductor materials which can be considered for the electrically active or optically active layers. Therefore, preferably, for a wide variety of materials of the first layer, a carrier means can be produced, which contains a weak solvent or solvent mixture, which can be set optimally by the addition of small quantities of aprotic polar solvents for the formation of an inductively doped mixed layer. Thus, a particularly simple and cost-effective production can be achieved.

An additional advantage of the application of the second layer under controlled superficial dissolution of the first layer is that, in addition to the improvement of the electrical performance by a doped mixed layer, the layer combination can also be used as a shield against the superficial dissolution of subsequent layers. Thus, the second material of the second layer can be selected in such a manner that it is less soluble by several orders of magnitude than the material of the underlying first layer or that the material of the second layer is soluble in a much smaller number of solvents. This allows the printing of the next layer, that is to say, for example, of an additional electrically or optically active layer, using carrier means from a larger selection of solvents.

The second semiconductor material can therefore be selected in such a manner that the second layer functions as a kind of electrically active sacrificial layer or interlayer (intermediate layer) which brings about a passivation with respect to additional solvents of the subsequent inks to be printed. By suitable selection of the solubility of the materials to be printed consecutively, a high number of layers can thus be applied in a component without undesired superficial dissolution of lower layers occurring. A production method that includes this embodiment saves time, material, work steps and therefore costs.

In a preferred embodiment of the invention, the optoelectronic component is characterized in that
the layer system comprises
at least one electron injection layer or electron extraction layer preferably near the cathode,
at least one electron transport layer
at least one optically active layer
at least one hole transport layer
at least one hole injection layer or hole extraction layer preferably near the anode,
wherein at least one inductively doped mixed layer is present between a hole transport layer and a hole injection layer or hole extraction layer and/or at least one inductively doped mixed layer is present between an electron transport layer and an electron injection layer or electron extraction layer.

In this preferred embodiment, the invention preferably relates to two groups of optoelectronic components. In the first group, the optically active layer is an emitter layer, which is used for light generation of light. In this case, the optoelectronic component is preferably used as organic light emitting diode (OLED). In the second group, the optically active layer is an absorber layer, in which free charge carriers are generated by the absorption of electromagnetic radiation. The second group of optoelectronic components thus preferably relates to organic solar cells or photodetectors.

In order to ensure an optimal functioning of the optically active layer of the component, a preferred arrangement of the electrically active layers occurs.

In a preferred embodiment, the invention relates to an optoelectronic component for the generation of light, for example, in the form of a light emitting diode. In this preferred embodiment, the optoelectronic component comprises a cathode and an anode and a layer system between the cathode and the anode, comprising at least one electron injection layer preferably near the cathode, at least one electron transport layer, at least one optically active layer which is an emitter layer, at least one hole transport layer, at least one hole injection layer preferably near the anode, and is characterized in that at least one inductively doped material is present between a hole transport layer and a hole injection layer and/or at least one inductively doped mixed layer is present between an electron transport layer and an electron injection layer.

In this preferred embodiment, the cathode is used as electron donor. Preferably, the cathode has a low surface resistance, in order to enable the most even possible injection of electrons over the surface of the OLED.

The electron injection layer, on the other hand, fulfills the function of balancing the work function of the cathode and the next layer, namely the electron transport layer. The work function preferably corresponds to the energy that has to be used at least in order to remove an electron from an uncharged solid. By the balancing of the work function of the cathode with respect to the electron transport layer, the voltage necessary for feeding or injecting electrons from the cathode into the electron transport layer is decreased.

The electron transport layer is used for the directed electron transport between cathode and the optically active layer, i.e., the preferred embodiment of the emitter layer. For this purpose, the electron transport layer should preferably have sufficient movability or mobility of electrons (preferably from $10^{-6}$ to 100 $cm^2/(V*sec)$). In addition, preferably, the charge transport energy level, i.e., the conduction band or LUMO (lowest unoccupied molecular orbital) of the electron transport layer, should lie between the energy level of the emitter material and the work function of the cathode, that is to say after the performance of the work function, no additional energy for the transport of the electrons before the recombination with the holes is necessary.

The emitter layer preferably consists of semiconductor organic polymers or molecules which, during electrical excitation, produce light in the visible range, i.e., preferably in a wavelength range of 400 to 700 nm. In the emitter layer, the electrons of the cathode preferably recombine with the holes of the anode to form excitons. Preferably, the proportion of singlet excitons predominates here, so that an effective light generation occurs.

The hole transport layer is the counterpart of the electron transport layer and used for the transport of (electron) holes from the anode to the emitter layer. Preferably, the hole transport layer therefore should exhibit sufficient movability or mobility of electron holes, preferably from $10^{-6}$ to 100 $cm^2/(V*sec)$). In addition, the energy level for the transport of the electron holes, i.e., the conduction band or HOMO (highest occupied molecular orbital) of the hole transport layer, should lie between the energy level of the emitter material and the work function of the anode.

The hole injection layer like its counterpart on the cathode side (the electron injection layer) preferably consists of strongly dielectric polymers and is preferably an insulator. Preferably, the hole injection layer is used to balance the energy levels of the anode and the next layer, namely the hole transport layer, in order to ensure an effective injection of electron holes.

The anode is preferably the electron hole donor and therefore preferably has a considerably higher work function than the cathode. Moreover, it is preferable that the anode has a high surface conductivity for holes. In addition, it can be preferable that the anode material is transparent, for example, to enable the exit of light through the anode.

In this preferred embodiment, the optically active layer is an emitter layer, and the electrically active layers are at least one electron injection layer, at least one electron transport layer, at least one hole transport layer, and at least one hole injection layer.

By the formation of one or more inventive mixed layers between the transport layers and injection layers, a particularly high electrical conductivity of the active layers can be achieved. The OLEDs that can be produced in this manner are characterized, in the case of identical applied voltage, by a strongly increased luminosity in comparison to OLEDs without doped mixed layers and thus by a considerably increased efficiency.

In this embodiment, by simple printing methods, in a manner suitable for mass production, OLEDs can thus be produced which, in addition to having low manufacturing costs, are also characterized by low operating costs and improved performance.

For the preferred embodiment of the second group, in which, instead of light generation, current generation by the component should occur, a person skilled in the art would adapt the electrically active layers and optically active layers preferably as follows.

As optically active layer, an absorber layer is preferably used, which is capable of converting, by photon absorption, the energy of the incident electromagnetic radiation into the generation of free charge carriers. The electrically active layers preferably ensure that within the optoelectric component, an internal electric field is generated, which separates the excitons and pulls the free charge carriers off towards the corresponding electrodes. On the cathode, the electrons are extracted, while on the anode the holes are extracted. The potential difference made available thereby is used for the generation of electrical voltage, or, under a load, an electric current.

In this preferred embodiment of the optoelectronic component, the layer structure is preferably as follows.

The optoelectronic component comprises a cathode and an anode and a layer system between the cathode and the anode, comprising at least one electron extraction layer preferably near the cathode, at least one electron transport layer, at least one optically active layer which is an absorber layer, at least one hole transport layer, at least one hole extraction layer preferably near the anode, and is characterized in that at least one inductively doped mixed layer is present between a hole transport layer and a hole extraction layer and/or at least one inductively doped mixed layer is present between an electron transport layer and an electron extraction layer.

The electrically active layers in turn are designed so that the functioning of the absorber layer and an effective extraction of the charge carriers are ensured. In this preferred embodiment, the optically active layer is an absorber layer, and the electrically active layers are the at least one electron extraction layer, the at least one electron transport layer, the at least one hole extraction layer, and the at least one hole transport layer.

In this embodiment as well, the provision of one or more inventive mixed layers between the transport layer and injection layers leads to particularly satisfactorily electrically active layers. The inductive doping in the mixed layers clearly improves the electrical properties of the transport or injection layers. The organic solar cells or phototransistors which can be produced in this manner are therefore characterized by a particularly satisfactorily light yield or sensitivity and thus by high efficiency.

Moreover, it is precisely for organic solar cells that the producibility via a printing method allows a high degree of flexibility for providing efficient solar cells for different applications. In addition, the costs can also be reduced in comparison to other methods.

In a preferred embodiment of the invention, the optoelectronic component is characterized in that the first or second layer is a hole injection layer or hole extraction layer, the organic semiconductor material of which is selected from a group comprising dielectric polymers, preferably polymers with functional groups selected from a group comprising —CN, —SCN, —F, —Cl, —I and/or —Br and particularly preferably polyvinylidene fluoride (PVDF), polyvinylidene chloride (PVDC), poly(vinylidene chloride-co-acrylonitrile), polyacrylonitrile (PAN), tetrafluoroethylene-hexafluoropropylene copolymer (FEP), polychlorotrifluoroethylene (PCTFE), hexaazatriphenylene hexacarbonitrile (HATCN), copper(II)hexafluoroacetyl acetonate [Cu(tfac)2], copper(II)trifluoroacetyl acetonates [Cu(hfac)], tungsten (IV & V) ethoxides (W-EtOH) as well as copolymers and mixtures thereof.

It is also advantageous that the first or second layer is a hole injection layer or hole extraction layer, the organic semiconductor material of which is selected from a group comprising dielectric polymers. These polymers exhibit superior electrical and mechanical properties and thus increase the reliability. They preferably are polymers with functional groups selected from a group comprising —CN, —SCN, —F, —Cl, —I and/or —Br, which are particularly robust and maintenance free. An improvement and a performance increase of the component are achieved particularly preferably by the inclusion in the at least one hole injection layer or hole extraction layer of polyvinylidene fluoride (PVDF), polyvinylidene chloride (PVDC), poly (vinylidene chloride-co-acrylonitrile), polyacrylonitrile (PAN), tetrafluoroethylene-hexafluoropropylene copolymer (FEP), polychlorotrifluoroethylene (PCTFE), hexaazatriphenylene hexacarbonitrile (HATCN), copper(II)hexafluoroacetyl acetonate [Cu(tfac)2], copper(II)trifluoroacetyl acetonates [Cu(hfac)], tungsten(IV & V) ethoxides (W-EtOH) as well as copolymers and mixtures thereof.

The above-mentioned materials are particularly suited for ensuring the electrical functioning of the injection or extraction layers for electron holes. In particular, the above-mentioned polymers ensure the preferred injection property, i.e., an increase in the work function for electrons on the surfaces in contact with the injection layer, and thus an effective hole injection.

In an additional preferred embodiment, the optoelectronic component is characterized in that the first or second layer is a hole transport layer, the organic semiconductor material of which is selected from a group comprising a doped metal thiocyanate, preferably a doped copper thiocyanate and/or a doped metal oxide, preferably a doped zinc oxide, preferably doped with a metal thiocyanate, preferably selected from a group comprising sodium thiocyanate, potassium thiocyanate, silver thiocyanate, tungsten thiocyanate, vanadium thiocyanate, molybdenum thiocyanate, copper thiocyanate and/or other transition metal thiocyanates, and/or preferably doped with a metal oxide, preferably selected from a group comprising tungsten oxide, vanadium oxide, nickel oxide, copper oxide, molybdenum oxide and/or other transition metal oxides, and/or preferably doped with a halogen, particularly preferably fluorine.

Accordingly, it is preferable that the first or second layer is a hole transport layer, the organic semiconductor material of which is selected from a group comprising a doped metal thiocyanate. Materials selected from this group are particularly easy to process. Preferably, a doped copper thiocyanate and/or a doped metal oxide can be included here, which have particularly advantageous mechanical properties. The doped zinc oxide which is also preferably included improves the efficiency of the component part. The preferred doping with a metal thiocyanate improves the electrical properties. The preferred selection of metal thiocyanate from a group comprising sodium thiocyanate, potassium thiocyanate, silver thiocyanate, tungsten thiocyanate, vanadium thiocyanate, molybdenum thiocyanate, copper thiocyanate and/or other transition metal thiocyanates ensures a performance increase of the component. The also preferable doping with a metal oxide eliminates errors in the production of the component. The fact that metal oxides are here preferably selected from a group comprising tungsten oxide, vanadium oxide, nickel oxide, copper oxide, molybdenum oxide and/or other transition metal oxides can make the component part more-maintenance-free. The also preferable doping with a halogen can further improve the electrical properties. Fluorine which is particularly preferable here increases both the reliability and also the efficiency of the component.

For the hole transport layer it is therefore preferable to dope a metal thiocyanate, particularly preferably a copper thiocyanate, or else a metal oxide, particularly preferably a zinc oxide. In this embodiment, doping denotes the introduction of foreign atoms, the dopants, into a layer, wherein the introduced quantity as a rule is smaller in comparison to the carrier material. I.e., it can be preferable that the mass fraction of the dopants is less than 10%, preferably less than 1%, of the total layer. However, it can also be preferable that the mass fraction of the dopants is up to 40% of the total layer. In so-called p-doping, electron acceptors are doped, whereas in so-called n-doping, electron donors are doped. Electron acceptor or electron donor preferably is understood to mean a particle (atom, molecule, ion) which is capable of accepting or donating electrons. For the hole transport layer, it is preferable to select materials which have strong acceptor properties and preferably a LUMO in the vicinity of the HOMO of the carrier of the metal thiocyanate or metal oxide, preferably of the copper thiocyanate or zinc oxide. An organic p-dopant can also preferably be, for example, tetrafluorotetracyanoquinodimethane or also hexaazatriphenylene hexacarbonitrile. They are characterized by a particular efficiency. It is particularly preferable to use, as carrier of the hole transport layer, copper thiocyanate, nickel oxides, copper(I) oxide or zinc oxide with the above-mentioned suitable dopants. This combination has improved electrical properties.

For the hole transport layers, it can moreover be particularly preferable to use, as organic semiconductor material, poly[(9,9-dioctylfluorenyl-2,7-diyl)-co-(4,4'-(N-(4-sec-butylphenyl)diphenylamine)] (TFB) and/or 4,4',4"-tris[phenyl(m-tolyl)amino]triphenylamine (m-MTDATA), which impressively exhibit(s) particular reliability.

It is particularly preferable to combine the materials mentioned preferably for the hole transport layers with the materials mentioned preferably for the hole injection and hole extraction layers. With a suitable selection of the solvents, satisfactory results can thereby be achieved for an inductively doped mixed layer.

In an additional preferred embodiment of the invention, the optoelectronic component is characterized in that the first or second layer is an electron injection layer or electron extraction layer, the organic semiconductor material of which is selected from a group comprising dielectric polymers, preferably hydrophilic polymers and/or polyelectrolytes, particularly preferably polymers selected from a group comprising polyoxazolines, polymethacrylates, polyacrylamides, polyethylene oxides, polyacrylic acids, polyacrylates, polyvinylpyrolidone, polysaccharides, ethylene-vinyl alcohol copolymer (EVOH), polyvinyl alcohol (PVOH) as well as copolymers thereof, and most particularly preferably polyethyleneimine (PEI) or ethoxylated polyethyleneimine (PEIE).

A preferred embodiment of the invention is thus characterized in that the at least one electron injection layer or electron extraction layer comprises dielectric polymers. These polymers are characterized by a particular robustness, whereby a component having a long useful life can be produced. Here, it is particularly preferable to use hydrophilic polymers and/or polyelectrolytes. They can be processed particularly easily and thus result in a saving of time, material and work steps and thereby costs. Most particularly preferable are polymers selected from a group comprising polyoxazolines, polymethacrylates, polyacrylamides, polyethylene oxides, polyacrylic acids, polyacrylates, polyvinylpyrolidone, polysaccharides, ethylene-vinyl alcohol copolymer (EVOH), polyvinyl alcohol (PVOH) as well as copolymers of this group. They have been found to be particularly useful and are characterized by superior electrical properties. In particular, the use of polyethyleneimine (PEI) or ethoxylated polyethyleneimine (PEIE) is preferable, since they lead to a further improvement and performance increase of the component.

The above-mentioned materials are particularly suitable for ensuring the electrical functioning of the injection or extraction layers for electrons. Thus, the electrons can use, as charge carrier, the "tunneling" quantum effect and jump either from the cathode into the electron transport layer (in the case of the electron injection layer) or from the electron transport layer toward the cathode (in the case of the electron extraction layer). The above-mentioned dielectric polymers preferably generate corresponding surface dipoles and thus reduce the injection barriers for electrons.

In an additional preferred embodiment, the optoelectronic component is characterized in that the first or second layer comprises an electron transport layer, the semiconductor material of which is selected from a group comprising a doped metal oxide, preferably a doped zinc oxide, wherein the doping occurs preferably with aluminum, magnesium, alkali, alkaline earth metals, metallocenes and/or organic n-dopants, and the electron transport layer particularly preferably comprises an aluminum zinc oxide.

A doped metal oxide is characterized in particular by a rise in the quality of the component. A doped zinc oxide results in a particularly robust component. The preferred doping with aluminum, magnesium, alkali, alkaline earth metals, metallocenes and/or organic n-dopants leads to improved electrical properties. An electron transport layer comprising an aluminum zinc oxide ensures a particularly effective component part.

In a preferred embodiment of the invention, the optoelectronic component is characterized in that the component comprises at least two electron injection layers or electron extraction layers, at least two electron transport layers and/or at least two hole transport layers and at least two hole injection layers or hole extraction layers, wherein the electron injection layers or electron extraction layers and the electron transport layers and/or the hole injection layers or hole extraction layers and the hole transport layers are arranged alternatingly, wherein between a transport layer and an injection layer or extraction layer in each case an inductively doped mixed layer is present.

By the formation of inductively doped mixed layers between the alternating electrically active layers, a particularly high performance of the component can be achieved. In the case of a suitable selection of the solubility of the materials of the electrically active layers to be built up respectively one on top of the other it is moreover possible to achieve a particularly stable layer structure.

In an additional preferred embodiment, the optoelectronic component is characterized in that a second inductively doped mixed layer is present between an electroactive layer and the optically active layer.

The mentioned advantages with regard to the improvement of the electrical performance due to the provision of additional charge carriers by the inductively doped mixed layer can be increased by the formation of an additional doped mixed layer between the optically active layer and the adjoining electrically active layer. For example, the carrier means of an emitter layer can be selected so that it superficially dissolves the underlying electrically active layer. A mixed layer induced in this manner contributes to the feeding of the charge carriers into the metal layer and thus increases the performance of the OLED.

In a preferred embodiment of the invention, the optoelectronic component is characterized in that the optically active layer is a light generating layer selected from a group comprising Super Yellow (polyphenylenevinylene copolymer), poly[2-methoxy-5-(3',7'-dimethyloctyloxy)-1,4-phenylenevinylene (MDMO-PPV), poly[9,9-didecanefluorene-alt-(bis-thienylene)benzothiadiazole] (PF10TBT), poly(9,9-di-n-octylfluorenyl-2,7,-diyl (PFO), poly(spirofluorene), poly(arylfluorene) as well as copolymers and mixtures thereof.

These materials are characterized by a high efficacy coefficient for the light generation. In addition, the mentioned materials are particularly suitable for the formation of inductively doped mixed layers on adjoining electrically active layers.

In an additional embodiment, the invention relates to a method comprising the following steps:
a) provision of a first ink comprising a first semiconductor material dissolved in a first carrier means b) provision of a second ink comprising a second semiconductor dissolved in a second carrier means
c) generation of a first layer by application of the first ink with the help of a printing method
d) drying of the first layer
e) application of the second ink with the help of a printing method onto the first layer for the generation of a second layer,
f) drying of the second layer
wherein the second carrier means is selected in such a manner that, by method step e), the first layer is at least partially superficially dissolved, so that between the first and second layer, an inductively doped mixed layer is generated, in which the first and second semiconductor materials are present mixed.

The method is preferably suitable for producing an optoelectronic component with a cathode and an anode and with a layer system between the cathode and the anode, comprising multiple electroactive layers and at least one optically active layer.

It can also be preferable that the method is modified in the following manner: after step b) follows step
b-bis) provision of a substrate.
In this modified method, moreover step c) becomes step
c') generation of a first layer by application of the first ink with the help of a printing method onto the substrate.

By this modified method, a very reliable and robust component can be produced.

Preferably, the first and second layers are an electroactive layer or an optically active layer. The method can preferably comprise additional steps. For example, first a cathode can be provided, for example, by a printing method step, in order to subsequently print as first layer an electrode injection layer onto the cathode (method steps c, d). Thus, in particular a maintenance-free component part is produced. Onto the first electrically active layer produced, a second layer, for example, an electron transport layer, can be printed for the formation of the mixed layer (method steps d-f). Thereby, the quality of the component part can be raised. For the production of a light generating optoelectronic component, it is possible to subsequently apply preferably, for example, an emitter layer, a hole transport layer, a hole injection layer and an anode. A component produced in this manner is particularly high-performance.

In particular, the method according to the invention is suitable for producing the optoelectronic component according to the invention. Advantageous embodiments which were disclosed for the component which can be produced according to the invention can also advantageously be applied to the method according to the invention. For example, for an embodiment of the optoelectronic component, it has been disclosed that the second carrier means preferably comprises at least one solvent which completely dissolves the first semiconductor material up to a concentration of at least 1 g/L. The person skilled in the art recognizes that a preferred embodiment of the inventive method also comprises providing such a solvent for the second carrier.

It has been pointed out that different alternatives to the described embodiments of the invention can be used in order to carry out the invention and arrive at the solution according to the invention. The inventive optoelectronic component and the production thereof in the described method, in terms of their designs, are thus not limited to the preferred embodiments above. Instead, multiple design variants are conceivable, which can deviate from the solution represented. The aim of the claims is to define the scope of protection of the

DETAILED DESCRIPTION OF THE FIGURES AND EXAMPLES

Example 1

Figure 1:
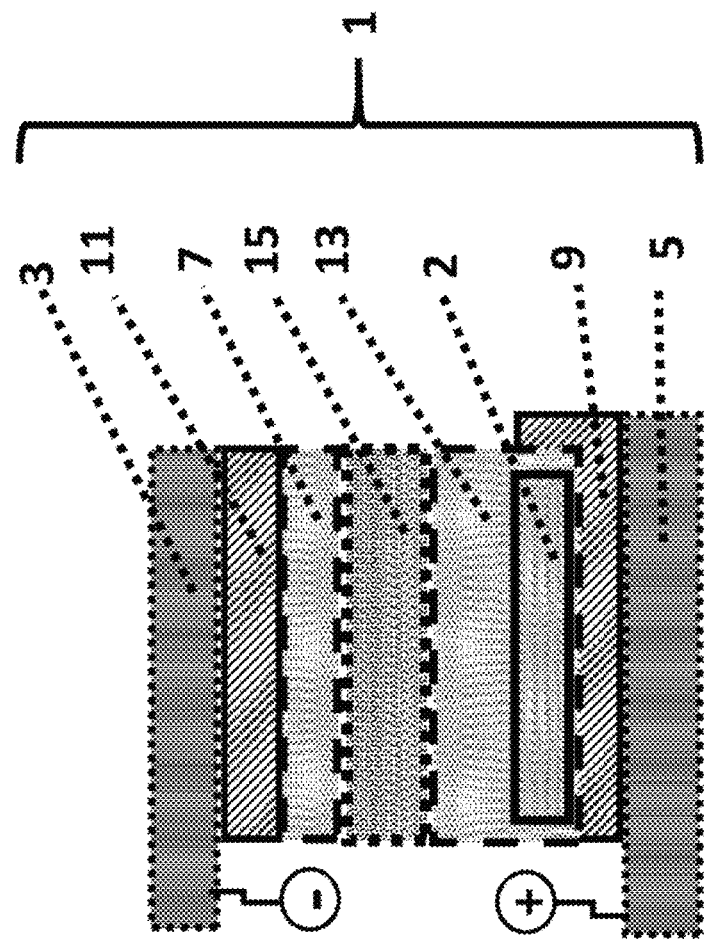
FIG. 1 diagrammatic representation of a preferred embodiment of the optoelectronic component with an inductively doped mixed layer FIG. 2 diagrammatic representation of a preferred embodiment of the optoelectronic component with two inductively doped mixed layers FIG. 3 diagrammatic illustration for the formation of charge transfer complexes in the case of known dopings FIG. 4 diagrammatic illustration of the inductive doping according to a preferred embodiment of the invention

FIG. 1 shows a diagrammatic representation of a preferred embodiment of the optoelectronic component 1 with an inductively doped mixed layer. The optoelectronic component 1 represented is an organic light emitting diode (OLED). The layer structure of same has the following composition. A cathode 3 is used for providing electrons, while the anode 5 supplies electron holes, as soon as a voltage is applied to them. The signs + and − indicate the respective voltage direction. The properties of the electron injection layer 7 and of the hole injection layer 9 preferably enable an efficient quantum mechanical tunneling of the charge carriers. The electron transport layer 11 and the hole transport layer 13 are characterized by a high mobility for the charge carriers and ensure a targeted transport toward the optically active layer 15 which is a light generating or emitter layer. In the optically active layer 15, the charge carriers recombine, with generation of excitons and the radiation of visible light.

The OLED represented is characterized in that, between the hole injection layer 9 and the hole transport layer 13, there is an inductively doped mixed layer 2. The inductively doped mixed layer 2 results from a successive application of the hole injection layer 9 and the hole transport layer 13 with the help of a printing method with suitable selection of the carrier means of the printing inks. Here, in particular the carrier means of the printing ink for the second hole transport layer 13 to be applied is selected in such a manner that it can superficially dissolve the material of the previously applied lower hole injection layer 9. By the superficial dissolution, based on the inductive effect, a mixed layer 2 forms, in which the material of the hole injection layer 9 is present doped in the hole transport layer 13. The doped mixed layer 2 formed in this way is characterized by high density and mobility of charge carriers, whereby the electrical performance of the optoelectronic component 1 can be increased.

Below, an example of a particularly preferable layer structure for an optoelectronic component 1 according to FIG. 1 is indicated:

| Function | Material | Layer thickness |
|---|---|---|
| Cathode 3 | Silver (Ag) | 250 nm |
| Electron transport layer 11 | Zinc oxide (ZnO) | 30 nm |
| Electron injection layer 7 | Polyethylenimine (PEI) | 8 nm |
| Optically active layer 15 | Poly(9,9-di-n-octylfluorenyl-2,7,-diyl) (PFO) | 50 nm |
| Hole transport layer 13 | Copper(I) thiocyanate | 17 nm |
| Inductively doped mixed layer 2 | Copper(I) thiocyanate + PAN-co-PVDC | 3 nm |
| Hole injection layer 9 | Poly-(vinylidene-co-acrylonitrile) [PAN-co-PVDC] | 5 nm |
| Anode 5 | Indium-tin oxide (ITO) | 150 nm |

The inductive mixed layer 2 can preferably be produced by the following method steps:

1) Provision of a first ink for the hole injection layer 9. In this ink, the organic semiconductor material PAN-co-PVDC is present dissolved in a first carrier means. A suitable composition is 1 mg/mL PAN-co-PVDC dissolved in 20 volume % acetophenone and 80 volume % ethyl-L-lactate.

2) Application of the first ink onto the anode 5 with the help of an ink jet printer, wherein the ITO has preferably been pretreated with ozone.

3) Drying of the applied layer with the help of an infrared lamp at 80° C. for 15 seconds, so that a layer thickness of the dry layer for the hole injection layer of 9 of 8 nm is achieved.

4) Provision of a second ink for the hole transport layer 13. In it, the inorganic semiconductor material Cu(I)SCN is present dissolved in a second carrier means. A suitable composition is 3 mg/mL Cu(I)SCN dissolved in 60 volume % mesitylene and 40 volume % 3-ethylpyridine.

5) Application of the second ink with Cu(I)SCN onto the dried hole injection layer 9 with PAN-co-PVDC.

6) Drying of the applied layer with the help of an infrared lamp at 80° C. for 15 seconds and subsequently at 110° C. for an additional 15 seconds, so that a theoretical layer thickness of 20 nm is achieved, of which 3 nm flow into the doped mixed layer and 18 nm remain as a pure layer.

Due to the selection of the second carrier means in the second ink for the hole transport layer 13, the PAN-co-PVDC of the hole injection layer 9 is superficially dissolved in steps 5) and 6), so that in the boundary region between the two applied layers an inductively doped mixed layer 2 consisting of Cu(I)SCN and PAN-co-PVDC forms.

For the mentioned method parameters, a final layer thickness of 5 nm for the hole injection layer 9, of 3 nm for the inductively doped mixed layer 2, and of 17 nm for the hole transport layer 13 is achieved.

The provision of the anode 5, onto which the hole transport layer 13 is applied, and the provision of the additional optically active layer 15, of the electron transport layer 11, of the electron injection layer 7 and of the cathode 3 also occur preferably by a printing method, preferably by an ink jet printing method, in order to obtain an optical element 1 according to FIG. 1.

Example 2

Figure 2:
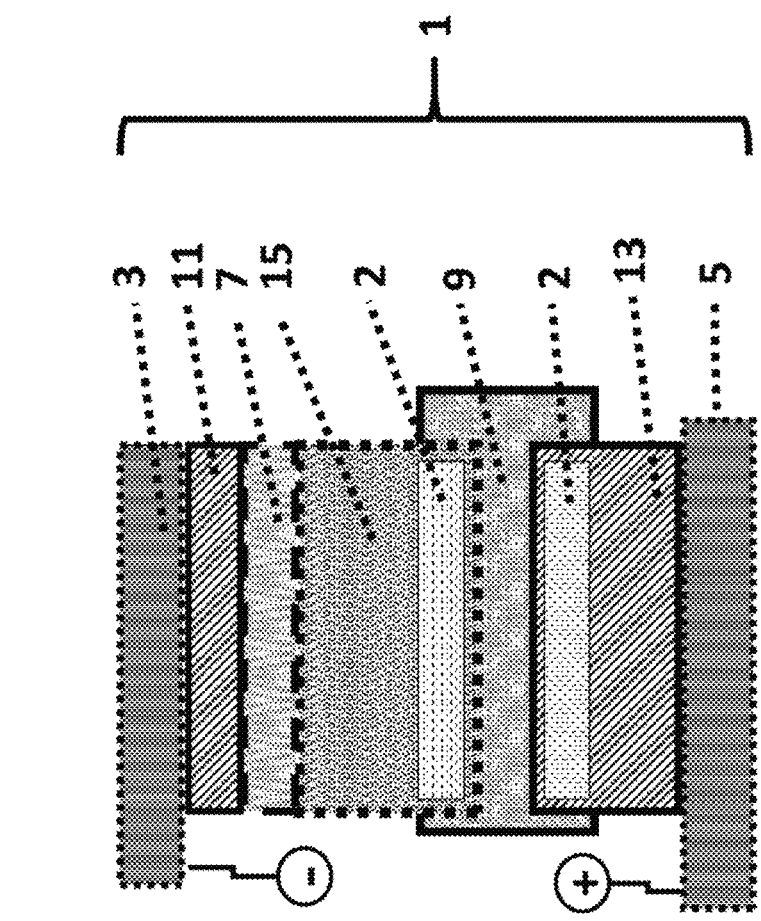

FIG. 2 shows a diagrammatic representation of an additional preferred embodiment of an optoelectronic component 1 with two inductively doped mixed layers 2. As in the case of FIG. 1, the optoelectronic component 1 represented is an organic light emitting diode (OLED). The function of the individual layers of the layer structure is analogous to FIG. 1.

However, the OLED represented is characterized in that both between a hole transport layer 13 and a hole injection layer 9 and also between the hole injection layer 9 and the optically active layer 15 an inductively doped mixed layer 2 is present in each case.

The inductively doped mixed layers result from successive application of the layers 13, 9 and 15 with the help of a printing method with suitable selection of the carrier means of the printing inks. In the process, in particular the carrier means of the printing ink for the second hole injection layer 9 to be applied is selected in such a manner that it can superficially dissolve the material of the previously applied lower hole transport layer 13. By superficial dissolution, based on the inductive effect, a mixed layer 2 forms, in which the material of the hole transport layer 13 together with the material of the hole injection layer 9 is present doped. Moreover, the carrier means for ink for the application of the optically active layer 15 is selected in such a manner that it in turn can superficially dissolve the hole injection layer 9. Thereby, a doped mixed layer 2 is formed between the optically active layer 15 and the hole injection layer 9.

The two mixed layers 2 formed in this manner increase the electrical performance of the optoelectronic component 1 particularly strongly and lead to a high luminosity with low current demand.

The following example represents a particularly preferred layer structure for an optoelectronic component 1 according to FIG. 2:

| Function | Material | Layer thickness |
| --- | --- | --- |
| Cathode 3 | Silver (Ag) | 250 nm |
| Electron transport layer 11 | Zinc aluminum oxide (ZnO:Al) | 35 nm |
| Electron injection layer 7 | Polyethylenimine (PEI) | 8 nm |
| Optically active layer 15 | Poly(9,9-di-n-octylfluorenyl-2,7,-diyl (PFO) | 50 nm |
| Inductively doped mixed layer 2 | PAN-co-PVDC with PFO | 5 nm |
| Hole injection layer 9 | Poly(vinylidene chloride-co-acrylonitrile) (PAN-co-PVDC) | 5 nm |
| Inductively doped mixed layer 2 | m-MTDATA with PAN-co-PVDC | 5 nm |
| Hole transport layer 13 | 4,4',4"-Tris[phenyl(m-tolyl)amino]triphenylamine (m-MTDATA) | 25 nm |
| Anode 5 | Indium-tin oxide (ITO) | 150 nm |

The two inductive mixed layers 2 can preferably be produced by the following method steps:

1) Provision of a first ink for the hole transport layer 13. In it, the organic semiconductor material m-MTDATA is present dissolved in a first carrier means. A suitable composition is 4 mg/mL m-MTDATA dissolved in 90 volume % ortho-dichlorobenzene and 10 volume % mesitylene.

2) Application of the first ink onto the anode 5 with the help of an ink jet printer, wherein the ITO has preferably been pretreated with ozone.

3) Drying of the applied layer with the help of an infrared lamp at 80° C. for 15 seconds, so that a layer thickness of the dry layer for the hole transport layer of 13 of 30 nm is achieved.

4) Provision of a second ink for the hole injection layer 9. In this hole injection layer, the organic semiconductor material PAN-co-PVDC is present dissolved in a second carrier means. A suitable composition is 3 mg/mL PAN-co-PVDC dissolved in 80 volume % ethyl-L-lactate and 20 volume acetophenone.

5) Application of the second ink with PAN-co-PVDC with the help of an ink jet printing method onto the dried hole transport layer 13 with m-MTDATA.

6) Drying of the applied layer with the help of an infrared lamp at 80° C. for 10 seconds, so that a theoretical layer thickness of 15 nm is achieved.

7) Provision of a third ink for the optically active layer 15. In this optically active layer, the organic semiconductor material PFO is dissolved in a third carrier means. A suitable composition is 7 mg/mL PFO dissolved in 75 volume % mesitylene, 20 volume % ortho-dichlorobenzene, and 5 volume % acetophenone.

8) Application of the third ink with PFO with the help of an ink jet printing method onto the dried hole injection layer 9 with PAN-co-PVDC. 9) Drying of the applied layer with the help of an infrared lamp at 80° C. for 15 seconds, so that a theoretical layer thickness for the optically active layer 15 of 55 nm is achieved.

Due to the selection of the second carrier means in the second ink for the hole injection layer 9, the m-MTDATA of the hole transport layer 13 is superficially dissolved in steps 5) and 6), so that in the boundary region between the two applied layers an inductively doped mixed layer 2 of PAN-co-PVDC and m-MTDATA is formed.

In the same way, due to the selection of the third carrier means in the third ink for the optically active layer 15, the PAN-co-PVDC of the hole injection layer 9 is superficially dissolved in steps 8) and 9), so that in the boundary region between the two applied layers an inductively doped mixed layer 2 of PFO and PAN-co-PVDC is formed.

For the mentioned method parameters, a final layer thickness of 25 nm for the hole transport layer 13 with m-MTDATA, of 5 nm for the inductively doped mixed layer 2 with PAN-co-PVDC and m-MTDATA, of 5 nm for the hole injection layer 9 with PAN-co-PVDC, of 15 nm for the inductively doped mixed layer 2 with PAN-co-PVDC and PFO, and of 50 nm for the optically active layer 15 with PFO is achieved.

The provision of the anode 5 onto which the hole transport layer 13 is applied as well as the provision of an additional electron injection layer 7, electron transport layer 11 and cathode 3 also preferably occur by a printing method, preferably by an ink jet printing method, in order to obtain an optoelectronic component 1 according to FIG. 2.

Figure 3:
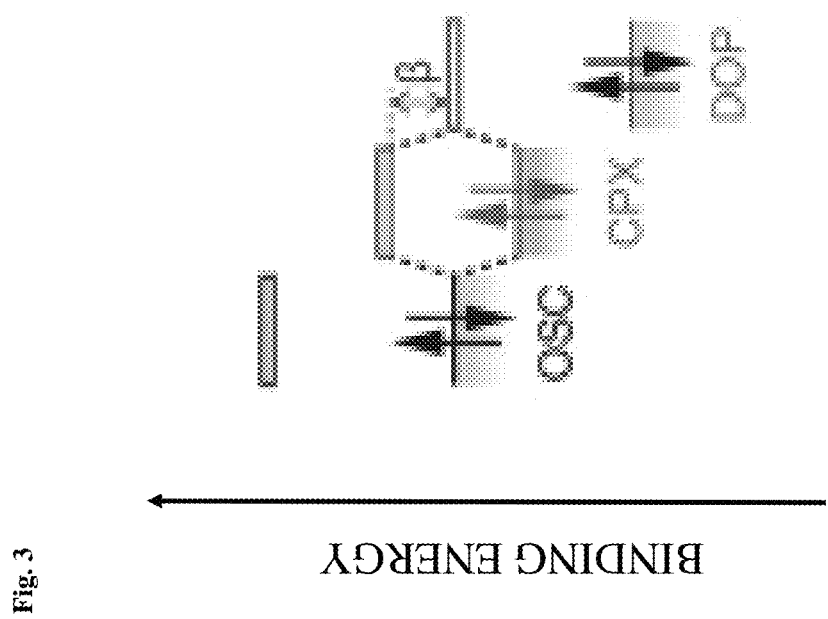

FIG. 3 shows a diagrammatic illustration of the formation of charge transfer complexes in known dopings of organic semiconductor materials. Here, for the formation of new intermolecular orbitals by hybridization between organic materials, for example, of molecules and/or polymers (Salzmann et al., Intermolecular Hybridization Governs Molecular Electrical Doping; Phys. Rev. Lett. 108, 035502 (2012), Méndez et al. Doping of Organic Semiconductors: Impact of Dopant Strength and Electronic Coupling; Angewandte Chemie 52; 7751-7755; (2013)).

As illustrated in FIG. 3, in known dopings of organic materials, hybridization between semiconductor and dopant occurs. Here, on the one hand, a charge carrier transfer occurs, whereby the charge transfer complexes are formed. The charge transfer complexes form a new chemical compound.

Figure 4:
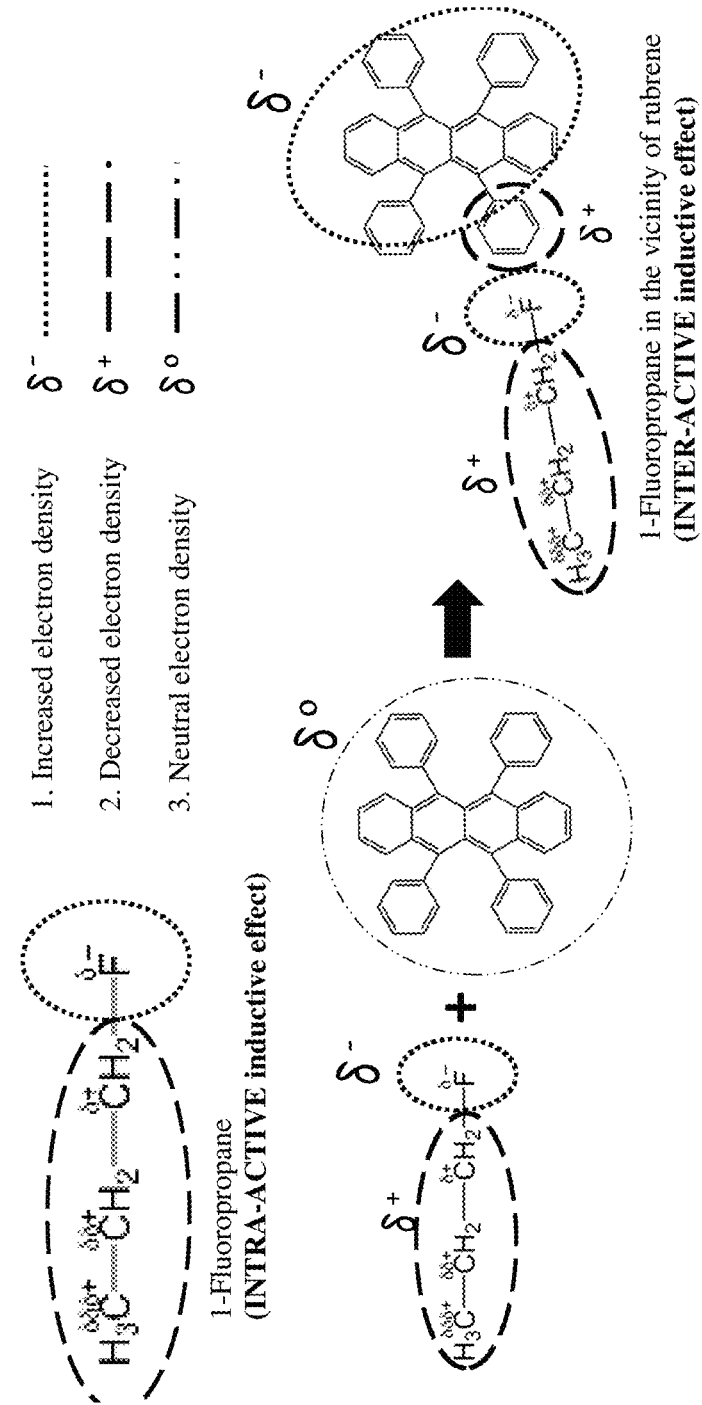

FIG. 4, in contrast, shows a diagrammatic illustration of the principle of the inductive doping. By an inductive effect, a shifting of intramolecular charge carrier densities occurs. The polarization has an effect on the electron density of the surrounding materials. The electron density of the adjacent molecules is changed, which facilitates the dissolution or addition of charge carriers in the adjacent molecules or polymers. FIG. 3A shows the intramolecular shift of the electron density in 1-fluoropropane (intra-active inductive effect). FIG. 3B shows the resulting shift of the electron charge density when the polarized 1-fluoropropane is brought into the vicinity of non-polarized rubrene. This charge shift enables the detachment or the addition of charge carriers in the adjacent molecules and thus the inductive doping.

LIST OF REFERENCE NUMERALS

1 Optoelectronic component
2 Inductively doped mixed layer
3 Cathode
5 Anode
7 Electron injection layer
9 Hole injection layer
11 Electron transport layer
13 Hole transport layer
15 Optically active step

The invention claimed is:

1. A method for producing an optoelectronic component (1) with a cathode (3) and an anode (5) and with a layer system between the cathode (3) and the anode (5), comprising multiple electroactive layers and at least one optically active layer (15), wherein at least two layers between the cathode (3) and the anode (5) are produced by a method comprising:
   a) providing a first ink comprising a first semiconductor material dissolved in a first carrier means;
   b) providing a second ink comprising a second semiconductor dissolved in a second carrier means;
   c) generating a first layer by application of the first ink with the help of a printing method;
   d) drying of the first layer;
   e) applying the second ink with the help of a printing method onto the first layer for the generation of a second layer;
   f) drying of the second layer;
   wherein the second carrier means is selected in such a manner that when the second ink is applied, the first layer is at least partially superficially dissolved, so that between the first and second layer, at least one inductively doped mixed layer is generated, in which the first and second semiconductor materials are present mixed, wherein the second carrier means comprises a mixture of at least two different solvents, wherein a first solvent completely dissolves the first semiconductor material up to a concentration of at least 1 g/L, and a second solvent completely dissolves the first semiconductor material up to a concentration of at most 0.1 g/L, and wherein the thickness of the mixed layer (2) is between 1 nm and 20 nm.

2. The method for producing an optoelectronic component (1) according to claim 1, wherein the layer system comprises:
   at least one of an electron injection layer (7) and an electron extraction layer;
   at least one electron transport layer (11);
   at least one optically active layer (15);
   at least one hole transport layer (13); and
   at least one of a hole injection layer (9) and a hole extraction layer;
   wherein the at least one inductively doped mixed layer (2) is present between the hole transport layer (13) and the hole injection layer (9) or the hole extraction layer, or the at least one inductively doped mixed layer (2) is present between the electron transport layer (11) and the electron injection layer (7) or the electron extraction layer.

3. The method for producing an optoelectronic component (1) according to claim 1, wherein the first or second layer is a hole injection layer (7) or hole extraction layer, the first and the second semiconductor materials are selected from a group consisting of dielectric polymers, preferably polymers with functional groups selected from a group comprising —CN, —SCN, —F, —Cl, —I and —Br and particularly preferably polyvinylidene fluoride (PVDF), polyvinylidene chloride (PVDC), poly(vinylidene chloride-co-acrylonitrile), polyacrylonitrile (PAN), tetrafluoroethylene-hexafluoropropylene copolymer (FEP), polychlorotrifluoroethylene (PCTFE), as well as copolymers and mixtures thereof, or the organic material of which is selected from a group comprising hexaazatriphenylene hexacarbonitrile (HATCN), copper(II)hexafluoroacetyl acetonate [Cu(tfac) 2], copper(II)trifluoroacetyl acetonates [Cu(hfac)] and tungsten(IV & V) ethoxides (W-EtOH) as well as copolymers and mixtures thereof.

4. The method for producing an optoelectronic component (1) according to claim 1, wherein the first or second layer is a hole transport layer (13), the first and second semiconductor materials are selected from a group consisting of a doped metal thiocyanate, preferably a doped copper thiocyanate and a doped metal oxide, preferably a doped zinc oxide, preferably doped with a metal thiocyanate, preferably selected from a group consisting of sodium thiocyanate, potassium thiocyanate, silver thiocyanate, tungsten thiocyanate, vanadium thiocyanate, molybdenum thiocyanate, copper thiocyanate and other transition metal thiocyanates, and preferably doped with a metal oxide, preferably selected from a group consisting of tungsten oxide, vanadium oxide, nickel oxide, copper oxide, molybdenum oxide and other transition metal oxides, and preferably doped with a halogen, preferably fluorine.

5. The method for producing an optoelectronic component (1) according to claim 1, wherein the first or second layer is an electron injection layer (7) or electron extraction layer, the first and second semiconductor materials are selected from a group consisting of dielectric polymers, preferably hydrophilic polymers and polyelectrolytes, particularly preferably polymers selected from a group consisting of polyoxazolines, polymethacrylates, polyacrylamides, polyethylene oxides, polyacrylic acids, polyacrylates, polyvinylpyrolidone, polysaccharides, ethylene-vinyl alcohol copolymer (EVOH), polyvinyl alcohol (PVOH) and copolymers thereof, and most particularly preferably polyethyleneimine (PEI) or ethoxylated polyethyleneimine (PEIE).

6. The method for producing an optoelectronic component (1) according to claim 1, wherein the first or second layer is an electron transport layer (11), the first and second semiconductor materials are selected from a group consisting of a doped metal oxide, preferably a doped zinc oxide, wherein the doping preferably occurs with aluminum, magnesium, alkali, alkaline earth metals, metallocenes or organic n-dopants, and the electron transport layer particularly preferably comprises an aluminum zinc oxide.

7. The method for producing an optoelectronic component (1) according to claim 1, wherein the inductively doped mixed layer (2) denotes a mixed layer formed by superficial dissolution, in which, due to doping based on the inductive effect, the electrical conductivity is increased.

* * * * *